United States Patent
Katscher et al.

(10) Patent No.: US 8,049,497 B2
(45) Date of Patent: Nov. 1, 2011

(54) MRI RF ENCODING USING MULTIPLE TRANSMIT COILS

(75) Inventors: Ulrich Katscher, Hamburg (DE); Peter Vernickel, Hamburg (DE); Peter Boernert, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 265 days.

(21) Appl. No.: 12/446,661

(22) PCT Filed: Oct. 31, 2007

(86) PCT No.: PCT/IB2007/054416
§ 371 (c)(1),
(2), (4) Date: Apr. 22, 2009

(87) PCT Pub. No.: WO2008/053436
PCT Pub. Date: May 8, 2008

(65) Prior Publication Data
US 2010/0016708 A1    Jan. 21, 2010

(30) Foreign Application Priority Data
Oct. 31, 2006  (EP) ..................................... 06123264

(51) Int. Cl.
*G01V 3/00*      (2006.01)

(52) U.S. Cl. ........................ 324/309; 324/307
(58) Field of Classification Search .................. 324/309, 324/307

See application file for complete search history.

(56) References Cited

U.S. PATENT DOCUMENTS

| 6,559,642 | B2 | 5/2003 | King |
| 6,949,928 | B2 * | 9/2005 | Gonzalez Ballester et al. ............................ 324/307 |
| 7,075,302 | B2 * | 7/2006 | Zhu ................. 324/318 |
| 7,375,523 | B1 * | 5/2008 | Hancu ........................ 324/307 |

FOREIGN PATENT DOCUMENTS

| WO | 02095435 A1 | 11/2002 |
| WO | 2004046756 A2 | 6/2004 |
| WO | 2004081518 A2 | 9/2004 |
| WO | 2005017549 A1 | 2/2005 |
| WO | 2006067727 A2 | 6/2006 |

OTHER PUBLICATIONS

Boehmer, J. P., et al.; Spatial Mapping of 23NA NMR signals by two-dimensional rotating frame imaging; 1990; Mag. Reson. in Med.; 16(2)335-341.

(Continued)

*Primary Examiner* — Louis Arana

(57) ABSTRACT

A common method of RF encoding assumes that the $B_1$ field generated by the RF coils is linear, which is likely not the case in many situations. It is therefore desirable to have a method of operating an MR system to reconstruct an image of a subject, wherein the method is capable of also handling arbitrary $B_1$ fields used for RF encoding. Accordingly, such an MR system employing one or more RF coils is disclosed herein. The method comprises obtaining transmit sensitivities and weighting factors for individual RF coils. Each RF coil is activated based on its respective weighting factor to apply RF excitation to a subject under examination in the MR system. MR signals—such as free induction decays (FID) signals or echo signals—generated from the subject in response to the RF excitation are received and processed based on the transmit sensitivities to generate an MR image or spectrum representative of the subject.

19 Claims, 6 Drawing Sheets

OTHER PUBLICATIONS

U. Katscher, et al.; B1-Gradient based MRI using a Multi-element transmit system; 2007; Proc. Intl. Soc. Mag. Reson. Med. 15; p. 679.
Farrher, et al.; Probing four orders of magnitude of the diffusion time in porous silica glass with unconventional NMR techniques; 2006; J. of Magnetic Resonance; 182(2)215-220.
Maudsley, A.A.,; Fourier imaging using RF phase encoding; 1986; Magnetic Resonance in Medicine; vol. 10; pp. 768-777.
Seifert, F., et al.; B1(+) steering by an adaptive 4-channel transmit/receive coil array; 2004; Proc. Intl. Soc. Mag. Reson. Med.; p. 1569.
Zhang, B., et al.; Parallel imaging methods for phased array MRI; 2003; Progress in Natural Science; vol. 13; pp. 170-174.
Baril, N., et al.; MR Detection of Mechanical Vibrations Using a Radiofrequency Field Gradient; 2002; J. of Magnetic Resonance; 154:22-27.

* cited by examiner

MRI RF ENCODING USING MULTIPLE TRANSMIT COILS

FIELD OF THE INVENTION

This invention relates to a magnetic resonance (MR) system, particularly to radio-frequency (RF) encoding using one or more RF transmit coils.

BACKGROUND OF THE INVENTION

The U.S. Pat. No. 7,701,211 discusses an MR imaging system in which desired RF excitation fields (also referred to as $B_1$ fields) are obtained in a fast and easy way. This object is achieved by a method of operating an MR imaging system, the method comprising the steps of determining complex weighting factors for a plurality of RF coils by measuring the transmit sensitivities of said RF coils and calculating the weighting factors for a given RF excitation, generating a plurality of individual coil drive signals, and individually setting the amplitude and/or phase of each of said coil drive signals according to the respective weighting factor.

SUMMARY OF THE INVENTION

RF encoding as performed in the above-mentioned document is based on an assumption of linear $B_1$ fields, i.e., a $B_1$ field corresponding to a constant $B_1$ gradient. This assumption is usually not fulfilled in practice, leading to limitations of RF encoding with respect to image quality. When MR signals collected from a subject in response to RF excitation pattern is processed to reconstruct an image of the subject, the deviation from the assumed linearity of the $B_1$ field could drastically affect image quality. Therefore, it is desirable to have a method of operating an MR system to reconstruct an image of a subject, wherein the method is capable of also handling arbitrary B1 fields. It is also desirable to have an MR system configured to implement such a method, as well as a computer program capable of enabling such an MR system to implement such a method.

Accordingly, the MR imaging or spectroscopy method disclosed herein defines a method of RF encoding that is capable of handling arbitrary $B_1$ fields that could be either linear or non-linear. The $B_1$ distributions may be measured in separate scans, prior to the actual imaging scan performed, for example to obtain a diagnostic image of a patient. The method is applicable to one-dimensional scans, i.e, spectra, as well as to two-dimensional or planar images and three-dimensional or volumetric images. The MR method comprises obtaining transmit sensitivities and weighting factors for individual RF transmit coils in an MR system comprising one or more such RF transmit coils. Each RF transmit coil is activated based on its respective weighting factor to apply RF excitation to a subject under examination in the MR system. MR signals— such as free induction decay (FID) signals or echo signals— generated from the subject in response to the RF excitation are received and processed based on the transmit sensitivities to generate an MR image or spectrum representative of the subject.

The weighting factor is mathematically calculated for each RF transmit coil based on its respective transmit sensitivity as well as on a defined $B_1$ gradient value. The defined $B_1$ gradient value may have a linear or non-linear distribution in one, two or three spatial dimensions. The weighting factor of each RF transmit coil determines the modification of the RF excitation pulse transmitted by the particular RF transmit coil to a subject under examination in the MR system. The MR signals received in response from the subject to the RF excitation pulses are received and processed based on the respective transmit sensitivity of each RF transmit coil. As the transmit sensitivities of the one or more RF transmit coils are taken into account both during the acquisition stage (i.e., in modifying the RF excitation pulses based on the respective weighting factor) as well as during the processing stage (i.e., during reconstruction), the proposed method is capable of handling any arbitrary shape of the $B_1$ gradient.

An MR system capable of implementing the proposed method is also disclosed herein. The MR system, including one or more RF transmit coils, comprises a mapping unit for obtaining a transmit sensitivity for each RF transmit coil, a weighting unit for obtaining a weighting factor for each RF transmit coil, an exciter unit for applying RF excitation to a subject by activating each RF transmit coil based on its respective weighting factor, a receiving unit for receiving MR signals from the subject generated in response to the applied RF excitation, and a processing unit for processing the received MR signals based on the transmit sensitivities, to generate an MR image or spectrum representative of the subject.

Furthermore, a computer program containing instructions to enable an MR system comprising one or more RF transmit coils to implement the proposed method is also disclosed herein. The computer program for operating the MR system comprises instructions for enabling a mapping unit to obtain a transmit sensitivity, and a weighting unit to obtain a weighting factor, for each RF transmit coil. The computer program further contains instructions to enable the exciter unit to apply RF excitation to a subject by activating each RF coil based on its respective weighting factor. The computer program also contains instructions to enable the receiving unit to receive MR signals from the subject generated in response to the applied RF excitation, and to enable the processing unit to process the received MR signals based on the transmit sensitivities, to generate an MR image or spectrum representative of the subject, when the computer program is run on a computer.

BRIEF DESCRIPTION OF THE DRAWINGS

These and other aspects will be described in detail hereinafter, by way of example, on the basis of the following embodiments, with reference to the accompanying drawings, wherein.

Corresponding reference numerals when used in the various figures represent corresponding elements in the figures.

DETAILED DESCRIPTION OF EMBODIMENTS

Figure 1:
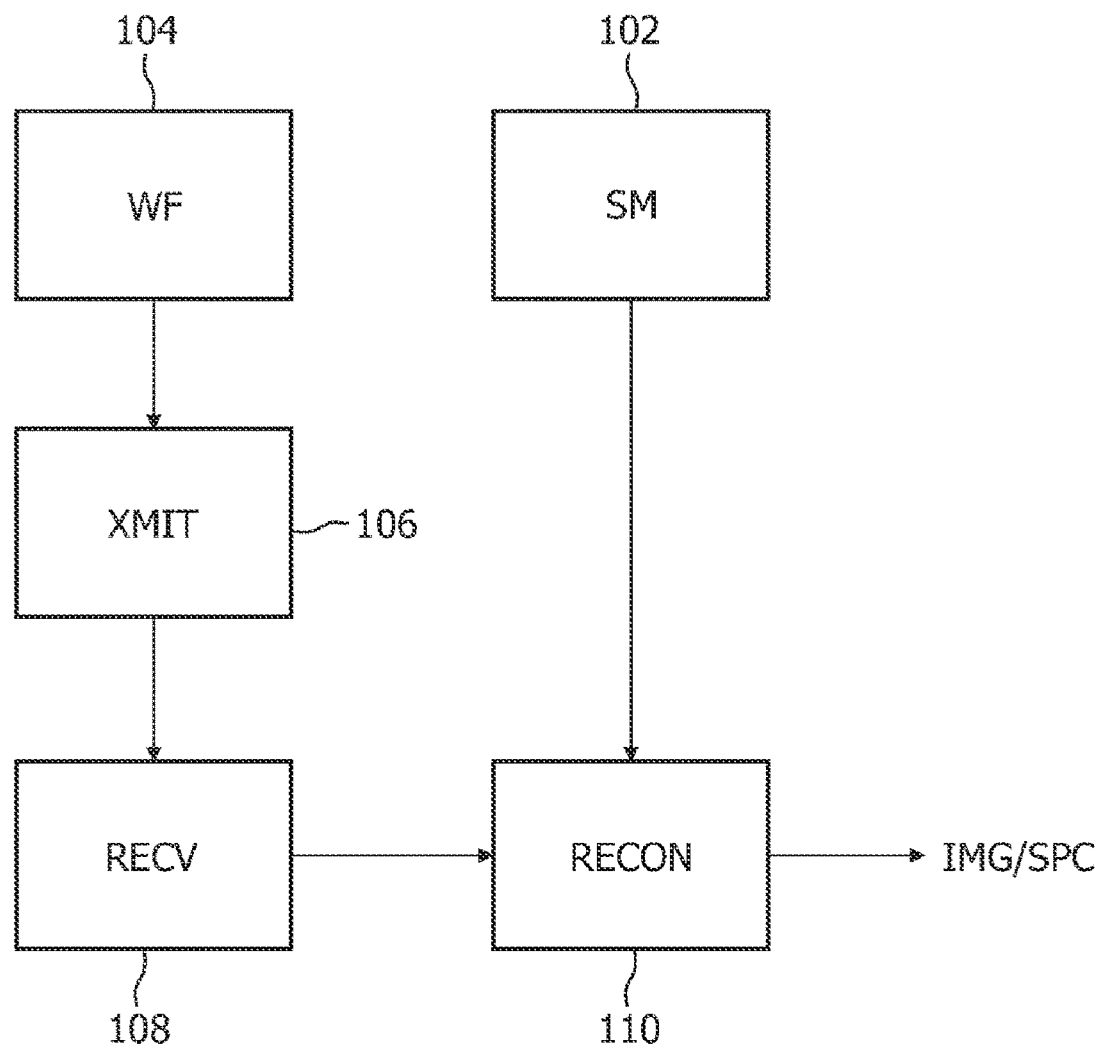
FIG. 1 diagrammatically represents an embodiment of the MR method disclosed herein.

FIG. 1 diagrammatically shows an embodiment of the method of operating an MR system as disclosed herein. In a mapping step (SM) 102, a map of the transmit sensitivities values of a plurality of RF transmit coils is obtained. A set of weighting factors for individual RF transmit coils, calculated based on transmit sensitivities of individual coils as well as on a desired $B_1$ gradient value, is obtained in a weighting step (WF) 104. RF excitation is applied during excitation to a subject in an excitation step (XMIT) 106, and MR signals generated from the subject in response to the RF excitation are received in a receiving step (RECV) 108. A single complex data point is acquired for every application of the $B_1$ gradient. The received MR signals are processed in a processing step (RECON) 110 to yield an MR image or an MR spectrum IMG/SPC.

Figure 2:
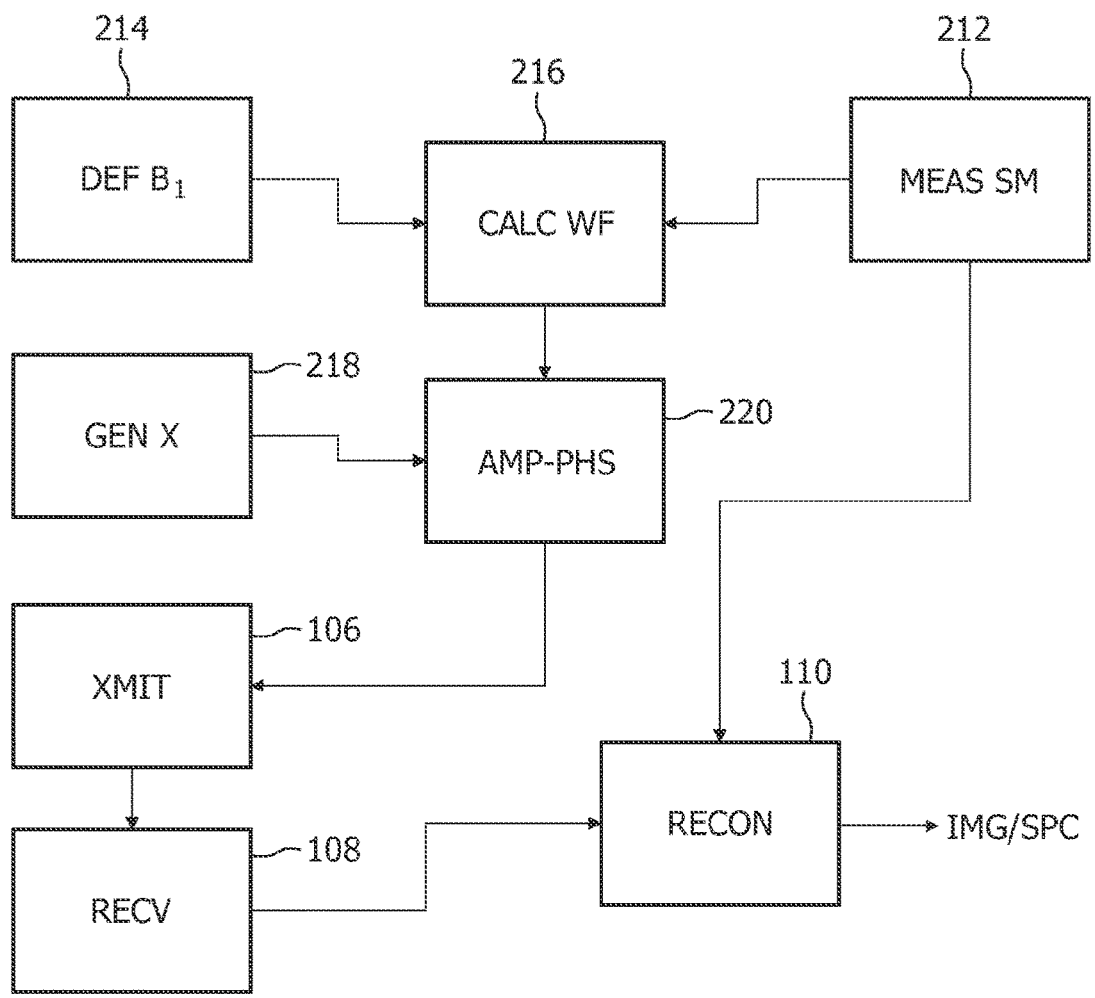
FIG. 2 diagrammatically represents a second embodiment of the MR method disclosed herein.

FIG. 2 diagrammatically shows another embodiment of the method disclosed, wherein the sensitivity map is obtained in a measurement step (MEAS SM) 212 by measuring sensitivities of individual coils in a plurality of coils, and a set of ideal or defined $B_1$ gradients is defined in a defining step (DEF $B_1$) 214. The weighting factors for the plurality of RF coils is calculated in a computation step (CALC WF) 216. A series of transmit pulses is generated in a generating step (GEN X) 218, and the amplitude and/or phase of each transmit pulse is adjusted in an adjusting step (AMP-PHS) 220. The series of transmit pulses is applied during excitation to a subject in the excitation step (XMIT) 106, and MR signals generated from the subject in response to the RF excitation are received in the receiving step (RECV) 108. The received MR signals are processed in the processing step (RECON) 110 to yield an MR image or an MR spectrum IMG/SPC.

Figure 3:
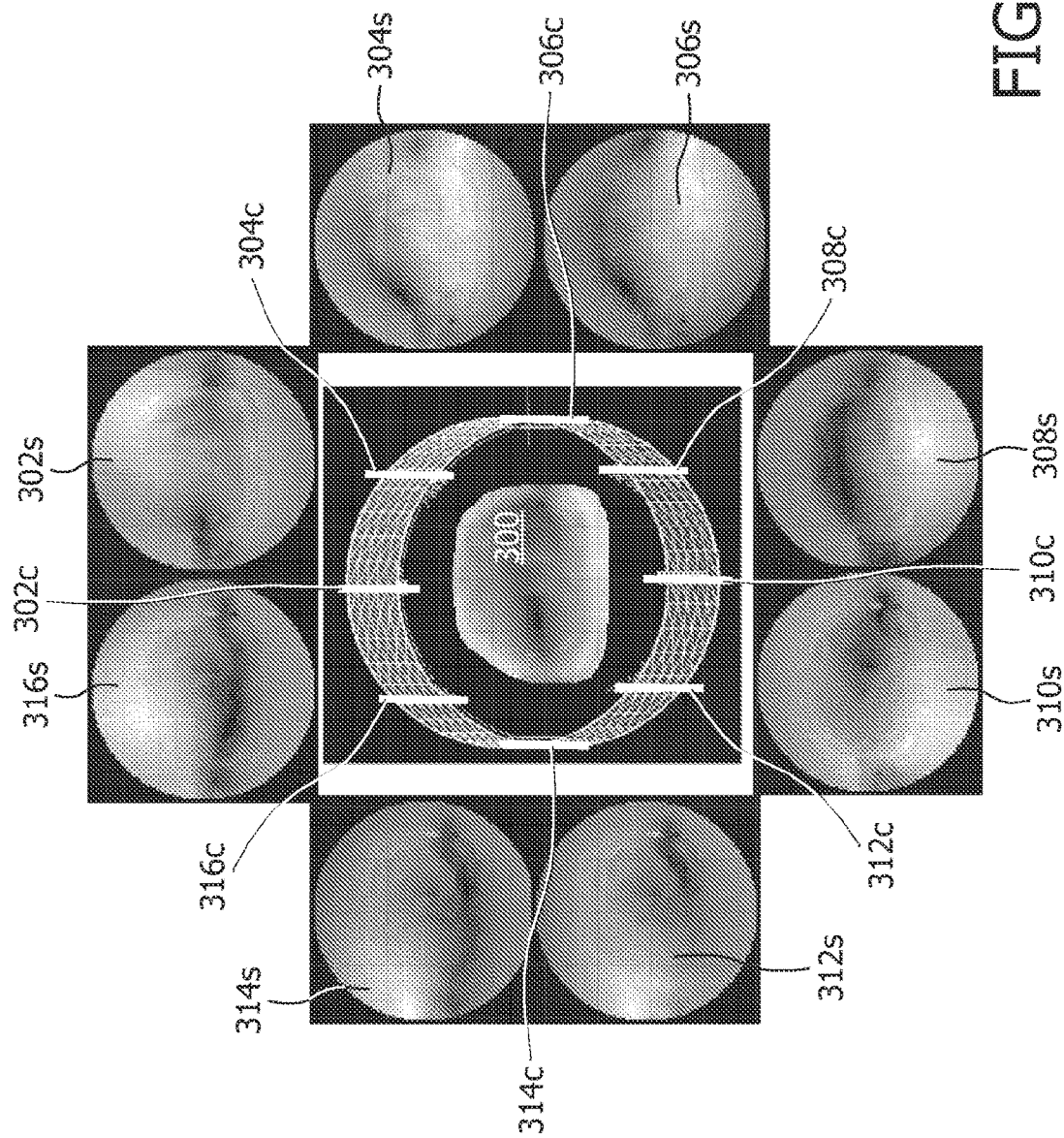
FIG. 3 shows a set of eight transmit sensitivity maps corresponding to each of eight RF coils forming part of a multi-transmit RF coil system.

FIG. 3 shows eight sensitivity maps corresponding to each of eight RF coils forming part of a multi-transmit RF coil system. The transmit sensitivities are measured on a region of interest 300, for example around the abdominal region of the patient. The eight transmit sensitivity maps 302s, 304s, 306s, 308s, 310s, 312s, 314s and 316s show the sensitivity values for a corresponding strip or coil 302c, 304c, 306c, 308c, 310c, 312c, 314c and 316c of the multi-transmit coil system, respectively. The multi-transmit coil system may alternatively be embodied as a plurality of independent surface coils placed in proximity to the region of interest.

In the field of MR imaging, spatial encoding is usually performed using $B_0$ gradients. An alternative method of spatial encoding is by using $B_1$ gradients, which is also called RF encoding. Details of RF encoding per se may be found in the article "Fourier imaging using RF phase encoding" by A. A. Maudsley, Magnetic Resonance in Medicine, vol. 10 (1986) pp. 768-777. As most of the acoustic noise during a scan in an MR system is generated from the $B_0$ gradients, RF encoding, which offers the possibility of omitting $B_0$ gradients altogether, could lead to a MR scanning procedure more or less free of acoustic noise.

With reference to FIGS. 1, 2 and 3, the sensitivity of each coil in a plurality of coils is obtained in a mapping step 102 or a measurement step 212 to create a sensitivity map. The transmit sensitivities are measured during one or more separate scans using known per se MR pulses sequences. Alternatively, the sensitivities may be measured once and stored, may be by the coil manufacturer; when the sensitivity map is required by the user, it is accessed from the stored location. The stored sensitivity map may be measured again and updated on a periodic basis to account for temporal changes in coil sensitivities. Alternatively, the sensitivity map may be simulated using known per se simulation techniques, for example on the basis of Biot-Savart law or other approximation of Maxwell's equations, by taking into account the characteristics of the coil as well as the subject being investigated using the coil. Of course, simulations of the sensitivity map may be limited in a practical sense due to exorbitant computational requirements or due to the fact that it may not be possible to simulate every aspect of the patient's geometry.

Figure 4:
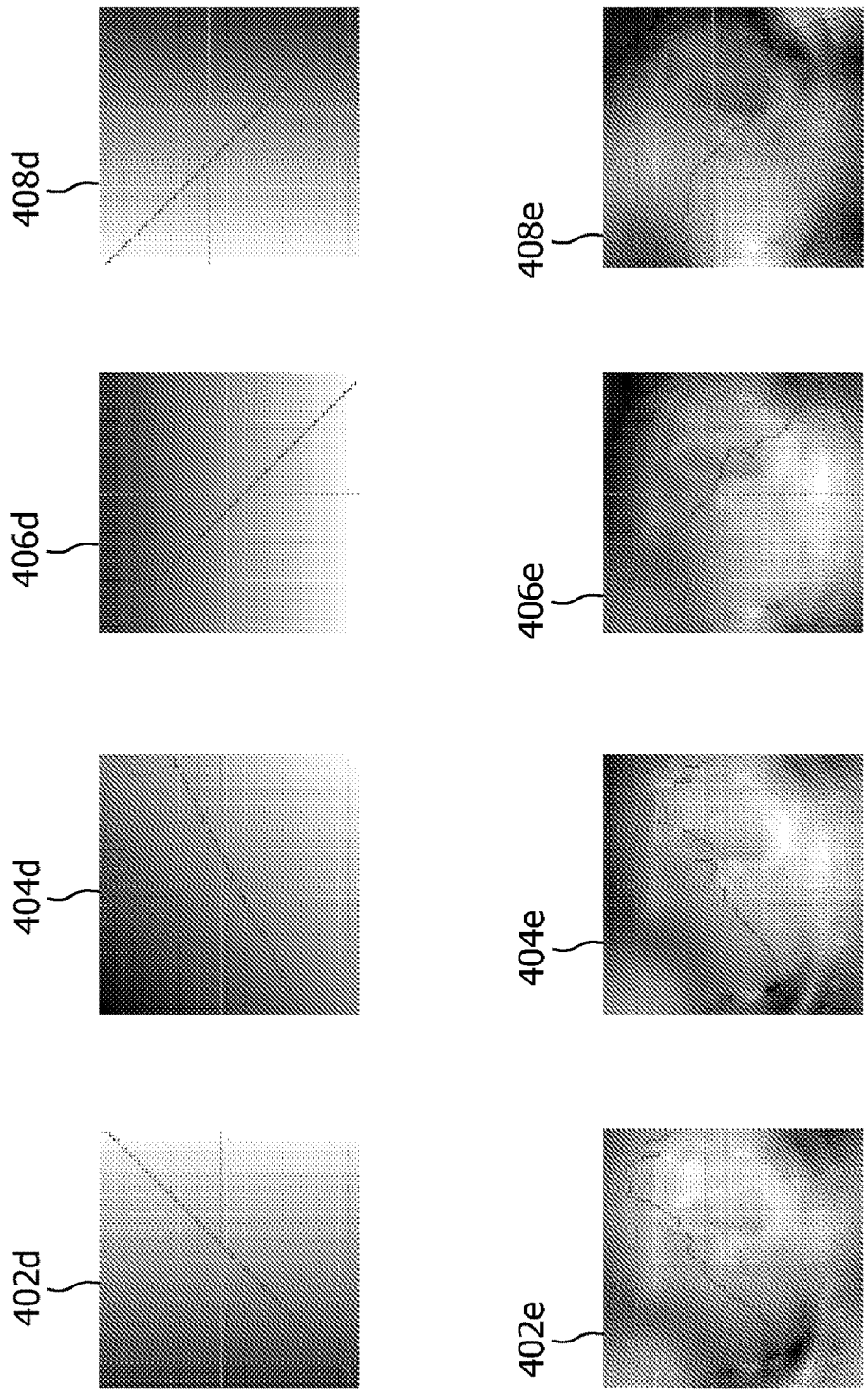
FIG. 4 shows a comparison between defined $B_1$ gradients (top row) and the corresponding effective $B_1$ gradients (bottom row) obtained according to the method disclosed herein.

FIG. 4 shows a comparison between defined linear $B_1$ fields 402d, 404d, 406d and 408d, and the corresponding effective $B_1$ fields 402e, 404e, 406e and 408e obtained according to the method disclosed herein. The correlation between the defined and corresponding effective $B_1$ fields is approximately 95%.

Figure 5:
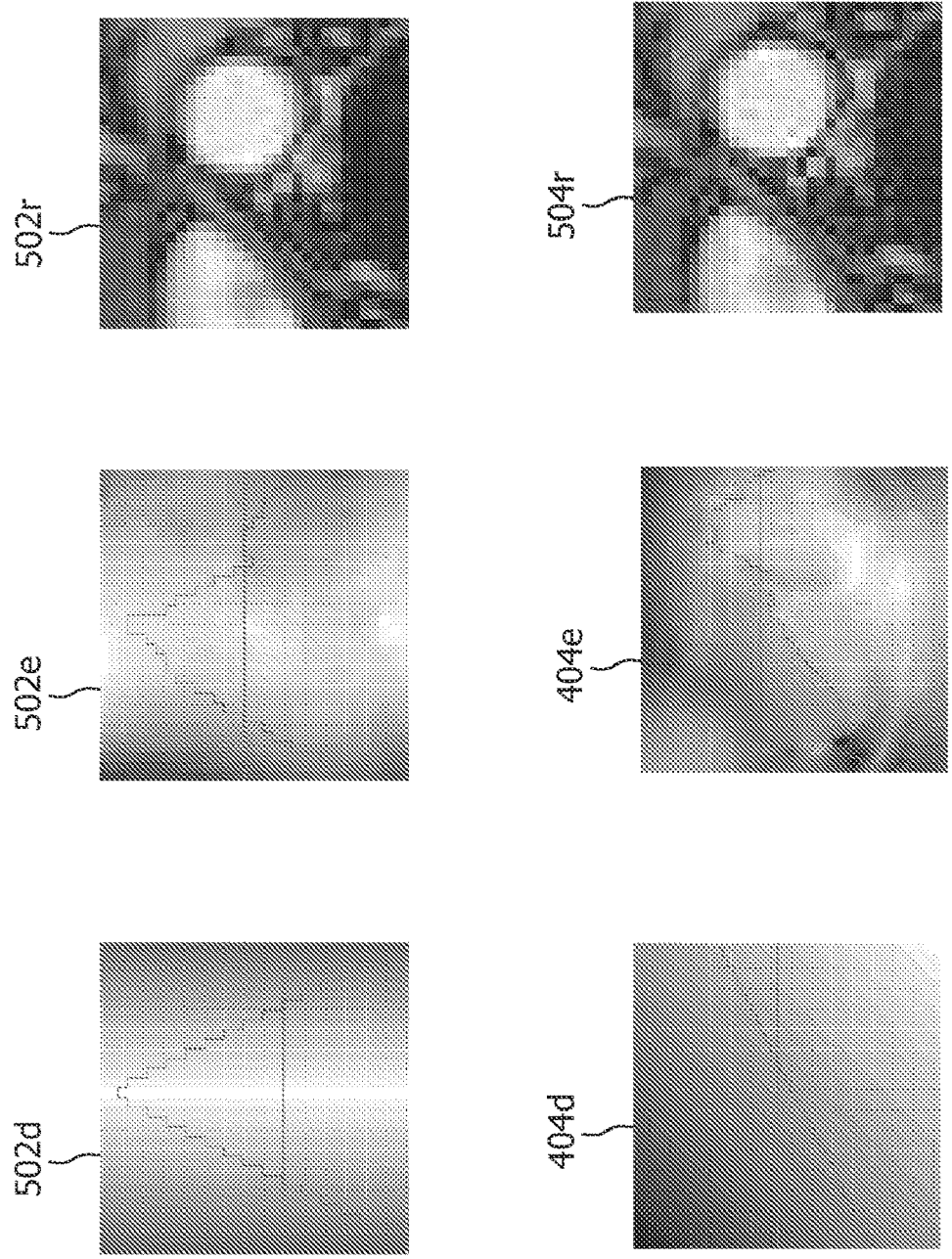
FIG. 5 shows a comparison between a defined non-linear $B_1$ field (top row, left image), the corresponding effective non-linear $B_1$ field (top row, middle image) and a reconstructed image using the effective non-linear $B_1$ gradient field (top row, right image), and a defined linear $B_1$ field (bottom row, left image), the corresponding effective linear $B_1$ field (bottom row, middle image) and a reconstructed image using the effective linear $B_1$ field (bottom row, right image)

FIG. 5 shows a comparison between a defined or desired non-linear $B_1$ field 502d and the corresponding effective non-linear $B_1$ field 502e, which has been used in reconstructing the image 502r. For an illustrative comparison, the linear $B_1$ field 404d and the corresponding effective linear $B_1$ field 404e of FIG. 4 are also shown, wherein the effective linear $B_1$ field 404e has been used in reconstructing the image 504r. The input MR signals used in the reconstruction of both images 502e and 504e are the same.

In the defining step 214, a set of desired or ideal $B_1$ gradients is defined. The chosen ideal $B_1$ gradients $B_{1uvw}$ may be linear distributions with u different amplitude slopes, v different phase slopes and w different radial spatial directions. The amplitude distributions for a single slope u and four different radial directions w of 0°, 45°, 90° and 180° are shown by the gradient maps 402d, 404d, 406d and 408d, respectively. Alternatively, the desired amplitude distribution may be non-linear, one possible embodiment of which is shown in the gradient map 502d. Furthermore, one can use "pure" phase gradients, wherein all the different $B_1$ gradients necessary for a scan vary only minimally in $B_1$ amplitude, and encoding is realized via the spatial $B_1$ phase distribution.

The desired linear or non-linear $B_1$ fields are approximated by an optimized superposition of the measured $B_1$ sensitivities. This leads to a list of weighting coefficients and a corresponding pulse duration for each gradient step, as described below. In some embodiments, the weighting factors are calculated using the equation:

$$\underline{U} = (\underline{S}^H \underline{S} + \lambda^2)^{-1} \underline{S}^H \underline{P} \quad \text{Equation 1}$$

wherein U is a vector denoting the optimal weighting factors for the plurality of RF coils, λ is a regularization parameter, S is a matrix of transmit sensitivities, the superscript H denotes the transposed complex conjugate of the concerned matrix, and P is a vector denoting the desired $B_1$ gradient, which usually is given inside a field or region of excitation. The matrix S denotes the transmit sensitivities of the various RF coils in the multi-transmit coil array. From the complex weighting factors U, the amplitude and phase of an excitation signal to be applied to a particular RF coil may be obtained in a known per se way, wherein the modulus of the complex factor corresponds to the amplitude of the excitation signal and the phase of the complex factor corresponds to the phase of the excitation signal. Further details about the optimized superposition algorithm may be obtained from the aforementioned U.S. Pat. No. 7,701,211.

In a generating step 218, an MR imaging or spectroscopy pulse sequence including a series of RF pulses is generated. The amplitude and phase of each RF pulse in the pulse sequence is adjusted in an adjusting step 220 for each RF coil based on the weighting factor of the respective RF coil. The RF coils then transmit the adjusted or optimized pulse sequence to the subject under examination in the excitation step 106. The subject may be for example, a human or an animal patient.

In a receiving step (RECV) 108, the MR signals generated in response to the transmitted RF pulses are received. Image reconstruction is performed during a processing step (RECON) 110, e.g., via matrix inversion using the previously measured transmit sensitivities.

In a particular implementation of the disclosed method, the weighting factor for individual radio-frequency transmit coils may be calculated by defining $B_1$ field targets such that the $B_1$ fields do not show much variation in the amplitude of the $B_1$-field but exhibit variations in the phase of the $B_1$-field that are appropriate for spatial encoding. A set of two-dimensional or three-dimensional $B_1$ gradients may be defined which form an appropriate orthogonal system to allow spatial signal encoding ensuring a sufficiently conditioned inverse problem.

In one embodiment, let us consider the inverse problem $$\underline{S} = \underline{\underline{E}} M_S \quad \text{Equation 2}$$

where S is a vector containing M acquired data points and $M_S$ contains the desired patient signal density or signal amplitude (including relaxation effects) discretized on a grid with N pixels. E is the N×M encoding matrix given by $$E_{nm} = \frac{B_{1m}(\vec{x}_n)}{|B_{1m}(\vec{x}_n)|} \sin(\gamma \tau |B_{1m}(\vec{x}_n)|) \quad \text{Equation 3}$$

with τ being the RF pulse duration and γ the gyromagnetic ratio. $B_{1m}$ denotes the M different $B_1$ gradients (m=1, 2, . . . M) and $x_n$ the N spatial grid points (n=1, 2, . . . N).

It may be noted that alternative reconstruction methods may also be used. For example, in order to shorten image reconstruction times, the reconstruction might be performed using dedicated backprojection techniques instead of the matrix inversion process mentioned above.

FIG. 5 illustrates the use of non-linear gradients, wherein instead of linear $B_1$ fields, a desired "roof-shaped" $B_1$ field is defined in the defining step 214. The weighting factors are calculated in the computation step 216, which are used to adjust the amplitude and phase of the RF excitation pulses (generated in the generating step 218) in the adjusting step 220. The amplitude-adjusted and/or phase-adjusted RF excitation pulses are applied to a subject in a transmitting step 106, and the MR signals generated from the subject is received in a receiving step 108. The received MR signals are processed in a processing step 110 to yield the image 502*r*. As may be seen by comparing the image 502*r* to the image 504*r* obtained from using the effective linear $B_1$ fields shown in image 404*e*, the results comparable in terms of image quality. However, the required RF power—and thus, the exposure of the subject to RF irradiation—is reduced by roughly a factor of two in the case of the roof-shaped $B_1$ gradient compared with the linear $B_1$ field. Such roof-shaped gradients might be an adequate gradient form especially in case of $B_1$ maxima in the center of the patient (or some other region of interest of the subject) due to dielectric resonance effects. Other shapes of $B_1$ gradients might be found further reducing the exposure of the patient to RF irradiation. Alternative desired $B_1$ gradient shapes might also help to stabilize image reconstruction at high image resolutions.

In the disclosed methods, the quality of the reconstructed image depends only moderately on the ability of the MR system to reproduce the desired or ideal $B_1$ gradients. However, if the experimentally obtained gradients lead to a non-singular matrix to be inverted during the reconstruction or processing step 110, image quality may be adversely affected. If greater reconstruction stability is required or desired for higher spatial resolutions and/or three-dimensional applications, dedicated transmit coils may be designed to produce the required $B_1$ gradients. All properties of the coil array, namely the type (loop, TEM, . . . ), the size, the shape, the placement and the number of channels might be optimized to yield a suitable coil array.

In the methods disclosed herein, $B_1$ gradients may be used exclusively to perform spatial encoding. Alternatively, the $B_1$ gradients may be combined with standard encoding via $B_0$ gradients to perform spatial encoding. The latter method could shorten total acquisition times, as well as reduce the exposure of the subject to RF irradiation. However, of course, the combined approach would also diminish some of the advantages of the disclosed method, in particular the absence of acoustic noise caused by the $B_0$ gradients. Furthermore, in order to shorten acquisition times, the proposed RF encoding method might be combined with parallel imaging techniques such as (SMASH) and SENSitivity Encoding (SENSE). Details about the SENSE technique may be found in the article "SENSE: Sensitivity Encoding for Fast MRI" by K. P. Preussmann, M. Weiger, M. B. Scheidegger, P. Boesiger, Magnetic Resonance in Medicine, vol. 42 (1999) pp. 952-962, and details about the SMASH technique may be found in U.S. Pat. No. 5,910,728. Acquisition times may also be shortened by utilizing the methods disclosed herein in multi-echo acquisition techniques, which might also be used for $T_2$ contrast mechanisms.

Besides standard MR imaging and spectroscopic applications, other applications that also utilize RF encoding techniques like Nuclear Quadrupole Resonance or motion detection may also benefit from implementing the methods disclosed herein. The proposed methods are also suitable for ultrashort echo time (UTE) acquisitions due to the FID sampling involved in the acquisition.

Figure 6:
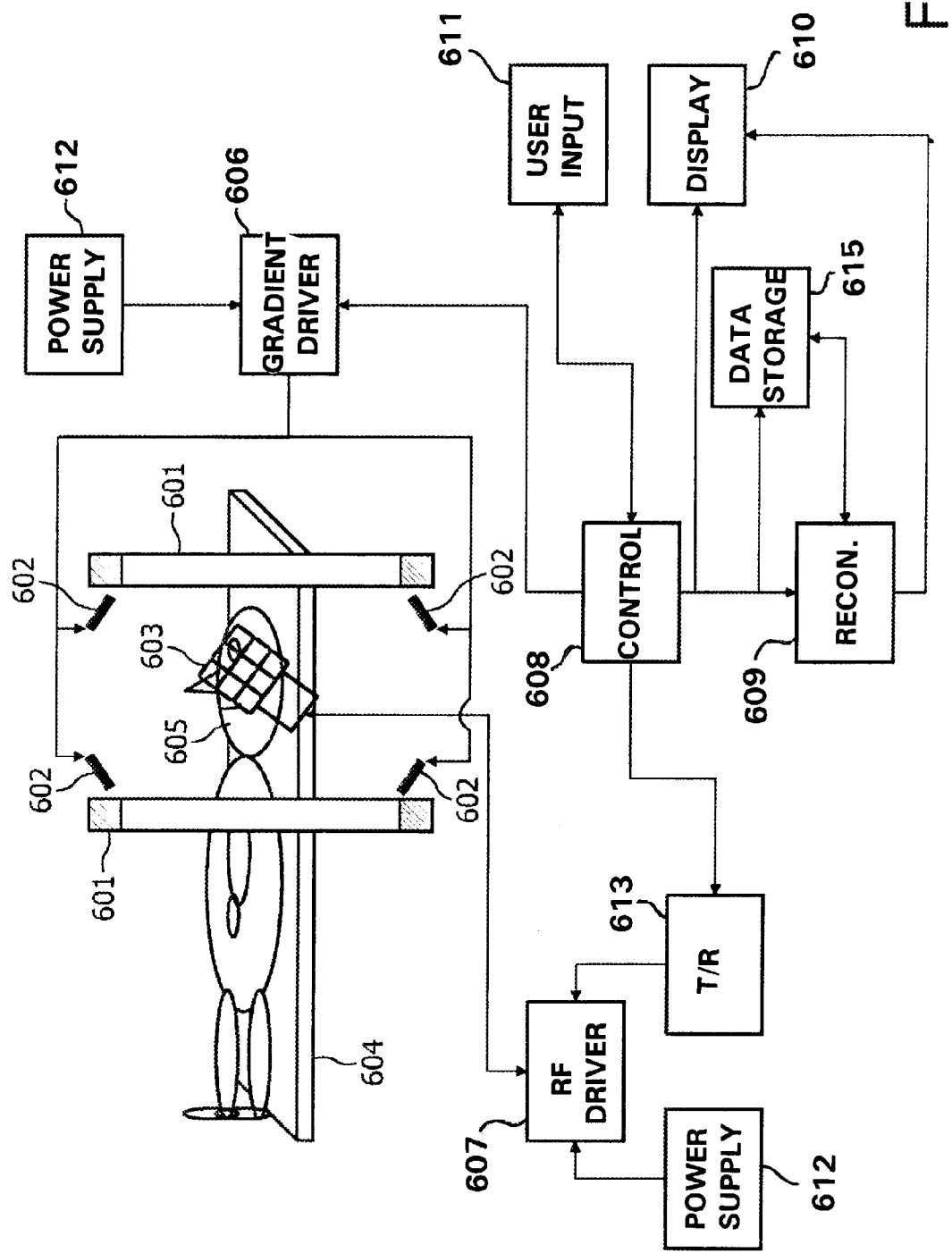
FIG. 6 schematically shows an MR system configured to implement the embodiments of the method disclosed herein.

FIG. 6 shows a possible embodiment of an MR system capable of implementing the method disclosed herein. The MR system comprises a set of main coils 601, multiple gradient coils 602 connected to a gradient driver unit 606, and RF coils 603 connected to an RF coil driver unit 607. The function of the RF coils 603, which may be integrated into the magnet in the form of a body coil, and/or may be separate surface coils, might further be controlled by one or more transmit/receive (T/R) switches 613. The multiple gradient coils 602 and the RF coils 603 are powered by a power supply unit 612. A transport system 604, for example a patient table, is used to position a subject 605, for example a patient, within the MR imaging system. A control unit 608 controls the RF coils 603 and the gradient coils 602. The control unit 608 further controls the operation of a reconstruction unit 609. The control unit 608 also controls a display unit 610, for example a monitor screen or a projector, a data storage unit 615, and a user input interface unit 611, for example, a keyboard, a mouse, a trackball, etc.

The main coils 601 generate a steady and uniform static magnetic field, for example, of field strength 1.0 T, 1.5 T or 3 T. The disclosed methods are applicable to other field strengths as well. The main coils 601 are arranged in such a way that they typically enclose a tunnel-shaped examination space (commonly referred to as the bore of the cylindrical magnet), into which the subject 605 may be introduced. Another common configuration comprises opposing pole faces with an air gap in between them into which the subject 605 may be introduced by using the transport system 604. To enable MR imaging, temporally variable magnetic field gradients superimposed on the static magnetic field are generated by the multiple gradient coils 602 in response to currents supplied by the gradient driver unit 606. The magnetic field gradients serve to encode spins in three-dimensional space so that they may be represented accurately in a representative image. Alternatively, the spatial encoding may be done using $B_1$ gradients, as proposed in the methods herein. It is also possible to use a combination of $B_1$ and $B_0$ encoding techniques to achieve the spatial encoding. The power supply unit 612, fitted with electronic gradient amplification circuits, supplies currents to the multiple gradient coils 602, as a result of which gradient pulses (also called gradient pulse waveforms) are generated. The control unit 608 controls the characteristics of the currents, notably their strengths, durations and directions, flowing through the gradient coils to create the appropriate gradient waveforms. The RF coils 603 generate RF excitation pulses in the subject 605 and receive MR signals generated by the subject 605 in response to the RF excitation pulses. The RF coil driver unit 607 supplies current to the RF coil 603 to transmit the RF excitation pulses, and amplifies the MR signals received by the RF coil 603. The transmitting and receiving functions of the RF coil 603 or set of RF coils are controlled by the control unit 608 via the T/R switch 613. The T/R switch 613 is provided with electronic circuitry that switches the RF coil 603 between transmit and receive modes, and protects the RF coil 603 and other associated electronic circuitry against breakthrough or other overloads, etc. The characteristics of the transmitted RF excitation pulses, notably their strength and duration, are controlled by the control unit 608.

It is to be noted that though the transmitting and receiving RF coil are shown as one unit in this embodiment, it is also possible to have separate coils for transmission and reception, respectively. It is further possible to have multiple RF coils 603 for transmitting or receiving or both. The RF coils 603 may be integrated into the magnet in the form of a body coil, or may be separate surface coils. They may have different geometries, for example, a birdcage configuration or a simple loop configuration, etc. The control unit 608 is preferably in the form of a computer that includes a processor, for example a microprocessor. The control unit 608 controls, via the T/R switch 613, the application of RF pulse excitations and the reception of MR signals comprising echoes, free induction decays, etc. User input interface devices 611 like a keyboard, mouse, touch-sensitive screen, trackball, etc., enable an operator to interact with the MR system. The MR signal received with the RF coils 603 contains the actual information concerning the local spin densities in a region of interest of the subject 605 being imaged. The received signals are reconstructed by the reconstruction unit 609, and displayed on the display unit 610 as an MR image or an MR spectrum. It is alternatively possible to store the signal from the reconstruction unit 609 in a storage unit 615, while awaiting further processing. The reconstruction unit 609 may be a digital image-processing unit that is programmed to derive the MR signals received from the RF coils 603.

The RF coil array consists of one or more transmit elements that may be independently activated and controlled. For example, the RF coil array shown in FIG. 3 consists of 8 strips 302c, 304c, 306c, 308c, 310c, 312c, 314c and 316c acting as independent transmit elements or RF coils, the strips together forming the shape of a cylinder similar in geometry to that of a birdcage coil. Exemplary dimensions of the formed cylindrical shape may be a radius of 34 cm and a length of 40 cm; such a coil array may be used to image a human abdomen. It may be noted that other dimensions and lengths of the cylinder will also work, and may be selected depending on the section of the anatomy to be imaged. It may also be noted that the birdcage geometry is only one possible geometry; the method disclosed herein may be implemented using other coil array geometries as well, for example planar geometries wherein the various strips are arranged in a planar fashion with or without overlap.

The methods disclosed herein may be implemented in hardware or in software as a computer program. The order in the described embodiments of the disclosed devices or the described implementations of the disclosed methods is not mandatory. A person skilled in the art may change the order of steps or perform steps concurrently using threading models, multi-processor systems or multiple processes without departing from the disclosed concepts.

The computer program disclosed herein may reside on a computer readable medium, for example a CD-ROM, a DVD, a floppy disk, a memory stick, a magnetic tape, or any other tangible medium that is readable by a computer. The computer program may also be a downloadable program that is downloaded, or otherwise transferred to the computer, for example via the Internet. The computer program may be transferred to the computer via a transfer means such as an optical drive, a magnetic tape drive, a floppy drive, a USB or other computer port, an Ethernet port, etc.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The disclosed methods can be implemented by means of hardware comprising several distinct elements, and by means of a suitably programmed computer. In the system claims enumerating several means, several of these means can be embodied by one and the same item of computer readable software or hardware. The mere fact that certain measures are recited in mutually different dependent claims does not indicate that a combination of these measures cannot be used to advantage.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A magnetic resonance method employing one or more radio-frequency coils, the method comprising:
    obtaining transmit sensitivities for individual radio-frequency coils;
    obtaining weighting factors for individual radio-frequency coils, wherein obtaining the weighting factor for each radio-frequency coil comprises:
        defining a $B_1$ gradient value for the one or more radio-frequency coils; and
        calculating the weighting factor for each radio-frequency coil based on a superposition of the respective $B_1$ gradient value and transmit sensitivity;
    applying radio-frequency excitation to a subject by activating each radio-frequency coil based on its respective weighting factor;

receiving magnetic resonance signals from the subject generated in response to the applied radio-frequency excitation; and processing the received magnetic resonance signals based on the transmit sensitivities, to generate a magnetic resonance image or a spectrum representative of the subject.

2. The method of claim 1, wherein obtaining the transmit sensitivities includes:

measuring the transmit sensitivity for each radio-frequency coil for the radio-frequency excitation in the subject.

3. The method of claim 1, wherein activating each radio-frequency coil based on its respective weighting factor includes:

setting an amplitude and/or phase of the excitation signal applied by the radio-frequency coil.

4. The method of claim 1, wherein receiving magnetic resonance signals from the subject generated in response to the applied radio-frequency excitation includes:

receiving a complex data point from the subject for each radio-frequency excitation.

5. The method of claim 1, wherein processing the received magnetic resonance signals based on the transmit sensitivities includes:

multiplying the received magnetic resonance signals by the inverse of a matrix of the transmit sensitivities.

6. The method of claim 1, wherein processing the received magnetic resonance signals based on the measured transmit sensitivities includes:

backprojecting the received magnetic resonance signals.

7. The method of claim 1, wherein the defined $B_1$ gradient value is non-linear.

8. The method of claim 1, wherein the resonance signals are spatially encoded by the $B_1$ gradient.

9. A non-transitory computer readable medium carrying software which controls one or more processors of a magnetic resonance system to perform the method of claim 1.

10. A magnetic resonance system comprising:
one or more radio frequency coils;
an RF transmitter;
an RF receiver; and
one or more processors programmed to perform the method of claim 1.

11. A magnetic resonance system comprising:
one or more radio-frequency coils;
a mapping unit which obtains transmit sensitivities for individual radio-frequency coils;
a weighting unit which obtains weighting factors for individual radio-frequency coils, the weighting unit including:
a gradient control unit which defines a $B_1$ gradient value for each radio-frequency coil, and
a computing unit which calculates the weighting factor for each radio-frequency coil based on a superposition of the respective $B_1$ gradient value and transmit sensitivity;
an exciter unit which applies radio-frequency excitation to a subject by activating each radio-frequency coil based on its respective weighting factor;

a receiving unit which receives magnetic resonance signals from the subject generated in response to the applied radio-frequency excitation; and a processing unit which processes the received magnetic resonance signals based on the transmit sensitivities, to generate a magnetic resonance image or spectrum representative of the subject.

12. The magnetic resonance system of claim 11, wherein the exciter unit includes:

a signal control unit which sets an amplitude and/or phase of the radio frequency excitation applied by each RF coil.

13. A magnetic resonance system comprising:
one or more RF coils which define an examination region;
an RF transmitter which applies RF signals to the RF coils to be transmitted into the region;
an RF receiver which receives resonance signals from the examination region,
one or more processors programmed to:
calculate weighting factors for the RF signals applied by the RF transmitter based on a defined RF field gradient and transmit sensitivity of each RF coil;
weight the radio frequency signals applied by the transmitter with the weighting factors;
reconstruct the resonance signals received by the receiver into a magnetic resonance image and/or spectrum.

14. The magnetic resonance system of claim 13, wherein weighting the radio frequency signals includes setting a phase of the RF signals applied by the RF transmitter.

15. The magnetic resonance system of claim 13, wherein the RF field gradient is non-linear.

16. A magnetic resonance method comprising:
defining a non-linear radio-frequency pulse gradient value;
calculating a weighting factor for each of a plurality of radio frequency coils based on the radio frequency pulse gradient value and a transmit sensitivity of the radio frequency coil;
weighting radio frequency pulses applied to each coil based on its respective weighting factor to induce resonance in a subject;
receiving resonance signals from the subject;
processing the resonance signals in accordance with the transmit sensitivities into at least one of an image and a spectrum.

17. A non-transitory computer-readable medium carrying software for controlling one or more processors to perform the method of claim 16.

18. A magnetic resonance system comprising:
one or more radio frequency coils;
an RF transmitter;
an RF receiver; and
one or more processors programmed to perform the method of claim 16.

19. The method of claim 16, further including:
on a display device, displaying the at least one image or spectrum.

* * * * *